United States Patent
Sato et al.

(10) Patent No.: US 7,666,569 B2
(45) Date of Patent: *Feb. 23, 2010

(54) POSITIVE RESIST COMPOSITION AND METHOD FOR FORMING RESIST PATTERN

(75) Inventors: Kazufumi Sato, Kawasaki (JP); Mitsuo Hagihara, Kawasaki (JP); Daisuke Kawana, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 287 days.

This patent is subject to a terminal disclaimer.

(21) Appl. No.: 10/540,056

(22) PCT Filed: Dec. 18, 2003

(86) PCT No.: PCT/JP03/16266

§ 371 (c)(1),
(2), (4) Date: Jun. 22, 2005

(87) PCT Pub. No.: WO2004/059392

PCT Pub. Date: Jul. 15, 2004

(65) Prior Publication Data

US 2006/0251986 A1    Nov. 9, 2006

(30) Foreign Application Priority Data

Dec. 26, 2002   (JP) .............................. 2002-376294

(51) Int. Cl.
G03F 7/004   (2006.01)

(52) U.S. Cl. ...................... 430/270.1; 430/905; 430/910

(58) Field of Classification Search .............. 430/270.1, 430/905, 910
See application file for complete search history.

(56) References Cited

U.S. PATENT DOCUMENTS

| | | | |
|---|---|---|---|
| 5,942,367 A | 8/1999 | Watanabe et al. | |
| 5,976,759 A | 11/1999 | Urano et al. | |
| 6,033,826 A | 3/2000 | Urano et al. | |
| 6,048,661 A | 4/2000 | Nishi et al. | |
| 6,143,460 A | 11/2000 | Kobayashi et al. | |
| 6,239,231 B1 | 5/2001 | Fujishima et al. | |
| 6,288,552 B1 | 9/2001 | Palmgren | |
| 6,432,608 B1 | 8/2002 | Fujie et al. | |
| 6,495,306 B2 | 12/2002 | Uetani et al. | |
| 6,495,307 B2 | 12/2002 | Uetani et al. | |
| 6,511,785 B1 | 1/2003 | Takemura et al. | |
| 6,593,056 B2 | 7/2003 | Takeda et al. | |
| 6,627,381 B1* | 9/2003 | Uetani et al. | 430/270.1 |
| 6,630,282 B2 | 10/2003 | Oomori et al. | |
| 6,656,660 B1 | 12/2003 | Urano et al. | |
| 6,723,483 B1* | 4/2004 | Oono et al. | 430/170 |
| 6,787,282 B2 | 9/2004 | Sato | |
| 6,846,609 B2* | 1/2005 | Uetani et al. | 430/270.1 |
| 6,949,329 B2 | 9/2005 | Endo et al. | |
| 7,005,230 B2* | 2/2006 | Yamamoto et al. | 430/270.1 |
| 7,312,014 B2 | 12/2007 | Maesawa et al. | |
| 2001/0044070 A1 | 11/2001 | Uetani et al. | |
| 2002/0025495 A1 | 2/2002 | Ogata et al. | |
| 2002/0164540 A1* | 11/2002 | Nakanishi et al. | 430/270.1 |
| 2003/0232273 A1 | 12/2003 | Adams et al. | |
| 2004/0033438 A1 | 2/2004 | Hamada et al. | |
| 2005/0031984 A1 | 2/2005 | Takata et al. | |
| 2005/0042541 A1 | 2/2005 | Hagihara et al. | |
| 2006/0247346 A1 | 11/2006 | Hojo et al. | |
| 2006/0251986 A1 | 11/2006 | Sato et al. | |
| 2007/0042288 A1 | 2/2007 | Hojo et al. | |

FOREIGN PATENT DOCUMENTS

| | | |
|---|---|---|
| EP | 1 357 284 A1 | 10/2003 |
| EP | 1357428 | 10/2003 |
| GB | 2 356 258 A | 5/2001 |
| JP | 4-211258 | 8/1992 |
| JP | 06-069118 | 3/1994 |
| JP | 8-254820 | 10/1996 |
| JP | H10-142799 | 5/1998 |
| JP | H10-306120 | 11/1998 |

(Continued)

OTHER PUBLICATIONS

Office Action Issued on Jul. 1, 2008, on the Japanese Patent Application No. 2004-142581.

(Continued)

*Primary Examiner*—John S Chu
(74) *Attorney, Agent, or Firm*—Knobbe, Martens, Olson & Bear, LLP

(57) ABSTRACT

A positive resist composition including a resin component (A) containing an acid dissociable dissolution inhibiting group whose alkali solubility increases under action of acid and an acid generator component (B) that generates acid on exposure, wherein the resin component (A) is a copolymer comprising a first structural unit (a1) derived from a hydroxystyrene and a second structural unit (a2) derived from a (meth)acrylate ester containing an alcoholic hydroxyl group, in which 10 mol % or more and 25 mol % or less of a combined total of hydroxyl groups within the structural units (a1) and alcoholic hydroxyl groups within the structural units (a2) are protected with the acid dissociable dissolution inhibiting groups, and a weight average molecular weight of the copolymer prior to protection with the acid dissociable dissolution inhibiting groups is 2,000 or more and 8,500 or less.

2 Claims, No Drawings

FOREIGN PATENT DOCUMENTS

| | | |
|---|---|---|
| JP | 11-119443 | 4/1999 |
| JP | H11-109631 | 4/1999 |
| JP | 11-168052 | 6/1999 |
| JP | 2000-26535 | 1/2000 |
| JP | 2000-086584 | 3/2000 |
| JP | 2000-188250 | 7/2000 |
| JP | 2000-214587 | 8/2000 |
| JP | 2000-356850 | 12/2000 |
| JP | 2001-056558 | 2/2001 |
| JP | 2001-142199 | 5/2001 |
| JP | 2001-166478 | 6/2001 |
| JP | 2001-274062 | 10/2001 |
| JP | 2002-055452 | 2/2002 |
| JP | 2002-062655 | 2/2002 |
| JP | 2002-062656 | 2/2002 |
| JP | 2002-241442 | 8/2002 |
| JP | 2002-287363 | 10/2002 |
| JP | 2002-323768 | 11/2002 |
| JP | 2002-373845 | 12/2002 |
| JP | 2003-075998 | 3/2003 |
| JP | 2003-107707 | 4/2003 |
| JP | 2003-107710 | 4/2003 |
| JP | 2003-295444 | 10/2003 |
| JP | 2004-012513 | 1/2004 |
| JP | 2004-078153 | 3/2004 |
| JP | 2004-333548 | 11/2004 |
| JP | 2004-333549 | 11/2004 |
| WO | WO 00/46640 | 8/2000 |
| WO | WO 01/73512 A1 | 10/2001 |
| WO | WO 03/007079 | 1/2003 |

OTHER PUBLICATIONS

Utsumi, "Low-energy E-Beam Proximity Lithography (LEEPL): Is the Simplest the Best?", Japanese Journal of Applied Physics, vol. 38, Part 1, No. 12B, pp. 7046-7051 (1999).

Decision to Grant a Patent issued on Aug. 26, 2008 on the counterpart Japanese Application No. 2003-334029 of the related U.S. Appl. No. 10/572,709.

Nakamura et al., "Ultra Thin Film Resist for Low Energy E-beam Projection Lithography", Journal of Photopolymer Science and Technology, vol. 15, No. 3, pp. 417-422, (2002).

Yoshizawa et al., "Comparative study of resolution limiting factors in electron beam lithography using the edge roughness evaluation method", Journal of Vacuum Science and Technology B, vol. 19, Issue 6, pp. 2488-2493, (2001).

Office Action Issued on Feb. 19, 2008, on the Japanese Patent Application No. 2003-334029.

Office Action Issued on Feb. 19, 2008, on the Japanese Patent Application No. 2003-347136.

Decision to Grant a Patent issued on the corresponding Japanese Patent Application No. 2004-119494, dated Dec. 16, 2008.

* cited by examiner

POSITIVE RESIST COMPOSITION AND METHOD FOR FORMING RESIST PATTERN

This application is the U.S. National Phase under 35 U.S.C. §371 of International Application PCT/JP2003/016266, filed Dec. 18, 2003, which claims priority to Japanese Patent Application No. 2002-376294, filed Dec. 26, 2002. The International Application was not published under PCT Article 21(2) in English.

TECHNICAL FIELD

The present invention relates to a positive resist composition and a method of forming a resist pattern.

Priority is claimed on Japanese Patent Application No. 2002-376294, the content of which is incorporated herein by reference.

BACKGROUND ART

KrF positive resist compositions, which have been proposed as ideal resist materials for exposure methods using a KrF excimer laser, typically utilize a polyhydroxystyrene-based resin in which a portion of the hydroxyl groups have been protected with acid dissociable dissolution inhibiting groups as the base resin. As the acid dissociable dissolution inhibiting group, so-called acetal groups including chain-like ether groups typified by 1-ethoxyethyl groups, cyclic ether groups typified by tetrahydropyranyl groups, tertiary alkyl groups typified by tert-butyl groups, and tertiary alkoxycarbonyl groups typified by tert-butoxycarbonyl groups are the most commonly used. See Patent References 1-3 below.

[Patent Reference 1]
Japanese Unexamined Patent Application, First Publication No. 2000-227658

[Patent Reference 2]
Japanese Unexamined Patent Application, First Publication No. 2000-188250

[Patent Reference 3]
Japanese Unexamined Patent Application, First Publication No. 2000-356850

In a resist composition comprising this type of polyhydroxystyrene-based resin as the base resin, the proportion of hydroxyl groups protected with the acid dissociable dissolution inhibiting groups is preferably high in order to ensure a high level of resolution. However, if the protection ratio provided by the acid dissociable dissolution inhibiting groups is too high, then the resist pattern tends to be prone to pattern defects following developing (hereafter also referred to as developing defects).

In the patent reference 1, a positive resist composition is disclosed which uses a copolymer comprising polymerization units derived from a hydroxystyrene monomer, polymerization units derived from 3-hydroxy-1-adamantyl methacrylate, and groups that are unstable in the presence of acid, and this copolymer becomes alkali soluble under the action of acid. However, a positive resist composition using this copolymer is particularly prone to microbridge-type developing defects.

DISCLOSURE OF INVENTION

An object of the present invention is to provide a positive resist composition, which enables the production of a high resolution resist pattern, and also enables a reduction in the number of developing defects, as well as a method of forming a resist pattern that uses this positive resist composition.

The inventors of the present invention discovered that with conventional polyhydroxystyrene-based resins, if the proportion of protected hydroxyl groups is increased, then although the insolubility of the unexposed portions of the resist film in an alkali developing solution increases, thereby improving the resolution, the hydrophobicity of the unexposed portions of the resist film also increases, meaning the affinity between the unexposed portions and the rinse liquid used in the rinsing step following developing deteriorates, thereby increasing the likelihood of developing defects.

In order to resolve this problem, a positive resist composition of the present invention comprises a resin component (A) containing an acid dissociable dissolution inhibiting group whose alkali solubility increases under action of acid and an acid generator component (B) that generates acid on exposure, wherein the resin component (A) is a copolymer comprising a first structural unit (a1) derived from a hydroxystyrene and a second structural unit (a2) derived from a (meth)acrylate ester containing an alcoholic hydroxyl group, in which 10 mol % or more and 25 mol % or less of a combined total of hydroxyl groups within the structural units (a1) and alcoholic hydroxyl groups within the structural units (a2) are protected with the acid dissociable dissolution inhibiting groups, and a weight average molecular weight of the copolymer prior to protection with the acid dissociable dissolution inhibiting groups is 2,000 or more and 8,500 or less.

Furthermore, the present invention also proposes the above type of positive resist composition for use in a thermal flow process.

Furthermore, a method of forming a resist pattern according to the present invention comprises forming a positive resist film on a substrate using a positive resist composition of the present invention, performing selective exposure of the positive resist film, conducting a developing treatment to form a resist pattern, and subjecting the resist pattern to a thermal flow treatment, thereby narrowing the resist pattern.

In this description, the term "(meth)acrylate" is used as a generic term meaning one or both of methacrylate and acrylate. The term "structural unit" refers to a monomer unit that contributes to the formation of a polymer.

By using a positive resist composition of the present invention, favorable resolution performance can be achieved, and the level of developing defects can be reduced.

A positive resist composition of the present invention can also be favorably employed within a pattern formation method that uses a thermal flow treatment and yields a favorable flow rate.

By using a positive resist composition of the present invention, and employing a pattern formation method that uses a thermal flow treatment, the level of resolution performance in the developing step is high, and developing defects can be prevented, meaning a high level of resolution performance and reduced defects can be achieved even for the narrowed resist pattern produced following the thermal flow treatment. Furthermore, a positive resist composition of the present invention can undergo a favorable thermal flow treatment even without the inclusion of a cross-linking agent component.

BEST MODE FOR CARRYING OUT THE INVENTION

As follows is a detailed description of the present invention.

A positive resist composition of the present invention comprises a resin component (A) containing an acid dissociable dissolution inhibiting group whose alkali solubility increases under action of acid and an acid generator component (B) that generates acid on exposure.

When acid that has been generated from the component (B) through exposure acts upon the component (A), the acid dissociable dissolution inhibiting groups within the component (A) dissociate, causing the entire component (A) to change from an alkali insoluble state to an alkali soluble state.

As a result, when a resist is exposed through a mask pattern during the formation of a resist pattern, or alternatively, is exposed and then subjected to a post exposure baking treatment, the exposed portions of the resist shift to an alkali soluble state, whereas the unexposed portions remain insoluble in alkali, meaning that alkali developing can then be used to form a positive resist pattern.

Resin Component (A)

In the present invention, the resin component (A) is a copolymer comprising a first structural unit (a1) derived from a hydroxystyrene, and a second structural unit (a2) derived from a (meth)acrylate ester containing an alcoholic hydroxyl group, wherein a portion of the hydroxyl groups within the structural units (a1) and the alcoholic hydroxyl groups within the structural units (a2) are protected with acid dissociable dissolution inhibiting groups.

In addition to the first structural unit (a1) and the second structural unit (a2), the copolymer may also comprise a third structural unit (a3) derived from a styrene.

First Structural Unit (a1)

The first structural unit (a1) of the component (A) is a structural unit derived from a hydroxystyrene, and is represented by a general formula (I) shown below. In this description, the name hydroxystyrene describes both the literal hydroxystyrene, as well as α-methylhydroxystyrene.

In the first structural unit (a1) represented by the general formula (I) shown below, the bonding position of the hydroxyl group may be the o-position, the m-position, or the p-position, while from the viewpoints of availability and cost, the p-position is preferred.

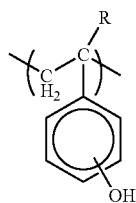

(I)

(wherein, R represents a hydrogen atom or a methyl group)

Second Structural Unit (a2)

The second structural unit (a2) of the component (A) is a structural unit derived from a (meth)acrylate ester containing an alcoholic hydroxyl group.

The component (A) of the present invention has a lower solubility in alkali developing solutions than conventional resins in which a portion of the hydroxyl groups of a polyhydroxystyrene have been protected with acid dissociable dissolution inhibiting groups. Accordingly, a satisfactory degree of insolubility in the alkali developing solution can be achieved with a specific protection ratio that is lower than that conventionally used, enabling the present invention to be successful in achieving higher resolution and a reduced level of developing defects.

In other words, in a conventional polyhydroxystyrene resin in which a portion of the hydroxyl groups have been substituted with acid dissociable dissolution inhibiting groups, all of the non-protected units are hydroxystyrene units. As a result, the solubility of such a resin in an alkali developing solution is considerably greater than that of the component (A) of the present invention.

In the present invention, these hydroxystyrene units are replaced with a structural unit of poorer alkali solubility, in which an alcoholic hydroxyl group has been introduced into a portion of the base resin side chains, thereby reducing the solubility of the resin in alkali developing solutions. Provided the second structural unit (a2) of the present invention displays this action, then there are no particular restrictions on the structural unit, and any structural unit derived from a (meth)acrylate ester containing an alcoholic hydroxyl group can be used. However, structural units derived from (meth)acrylate esters containing an aliphatic polycyclic group with an alcoholic hydroxyl group display particularly superior resolution and dry etching resistance, and are consequently preferred.

Examples of the polycyclic group that constitutes the aliphatic polycyclic group containing an alcoholic hydroxyl group include groups in which one hydrogen atom has been removed from a bicycloalkane, a tricycloalkane, a tetracycloalkane, or the like. Specific examples include groups in which one hydrogen atom has been removed from a polycycloalkane such as adamantane, norbornane, isobornane, tricyclodecane, or tetracyclododecane. These types of polycyclic groups can be appropriately selected from the multitude of groups proposed for use with ArF resists. Of these groups, adamantyl groups, norbornyl groups, and tetracyclododecanyl groups are preferred in terms of industrial availability.

As the second structural unit (a2), structural units derived from (meth)acrylate esters containing an adamantyl group with at least one alcoholic hydroxyl group, as represented by a general formula (II) shown below, can be particularly favorably employed.

Of the second structural units (a2) represented by the general formula (II) shown below, structural units represented by a general formula (IIa) are the most desirable.

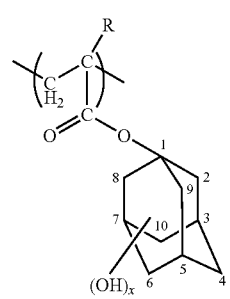

(II)

(wherein, R represents a hydrogen atom or a methyl group, and x represents an integer form 1 to 3)

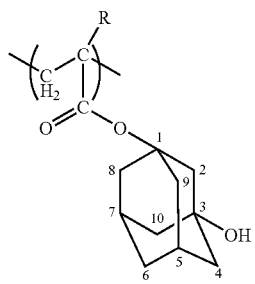

(wherein, R represents a hydrogen atom or a methyl group)

Acid Dissociable Dissolution Inhibiting Group

In the component (A), a portion of both the hydroxyl groups of the first structural unit (a1) and the alcoholic hydroxyl groups of the second structural unit (a2) are protected with acid dissociable dissolution inhibiting groups.

As the acid dissociable dissolution inhibiting groups, any of the multitude of acid dissociable dissolution inhibiting groups proposed for use with conventional chemically amplified KrF positive resist compositions or ArF positive resist compositions can be selected and used, and specific examples include chain-like or cyclic tertiary alkyl groups such as tert-butyl groups, tert-amyl groups, 1-methylcyclopentyl groups, 1-ethylcyclopentyl groups, 1-methylcyclohexyl groups, and 1-ethylcyclohexyl groups, cyclic ether groups such as tetrahydropyranyl groups and tetrahydrofuranyl groups, or 1-lower alkyl alkoxyalkyl groups represented by a general formula (III) shown below, in which the 1-position is substituted with a straight-chain, branched, or cyclic alkoxy group of 1 to 8 carbon atoms. Of these groups, 1-lower alkyl alkoxyalkyl groups represented by the general formula (III) are particularly preferred. Specific examples of these groups include straight-chain or branched alkoxyalkyl groups such as 1-ethoxyethyl groups or 1-isopropoxyethyl groups and cyclic alkoxyalkyl groups such as 1-cyclohexyloxyethyl groups, and of these, 1-ethoxyethyl groups are particularly desirable as they provide excellent resolution performance.

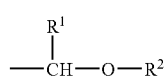

(wherein $R^1$ represents an alkyl group of 1 to 4 carbon atoms, and $R^2$ represents either a straight-chain or branched alkyl group of 1 to 8 carbon atoms, or a cycloalkyl group of 5 to 7 carbon atoms)

In the present invention, the protection ratio for the hydroxyl groups within the component (A) is set so that 10 mol % or more and 25 mol % or less of the combined total of hydroxyl groups within the first structural units (a1) and alcoholic hydroxyl groups within the second structural units (a2) are protected, with ratios from 15 mol % or more and 20 mol % or less being particularly desirable.

By ensuring that the hydroxyl group protection ratio is no greater than the upper limit of the above range, developing defects can be effectively prevented, whereas ensuring that the ratio is at least as large as the lower limit of the above range enables a favorable resolution performance to be achieved.

There are no particular restrictions on the respective protection ratios for the hydroxyl groups of the first structural unit (a1), and the alcoholic hydroxyl groups of the second structural unit (a2), while the resins in which either only the hydroxyl groups of the first structural unit (a1) (the hydroxystyrene phenolic hydroxyl groups) are protected or the resins in which both the hydroxyl groups of the first structural unit (a1) and the alcoholic hydroxyl groups of the second structural unit (a2) are protected by the acid dissociable dissolution inhibiting groups, are preferred.

Furthermore, although dependent on the actual acid dissociable dissolution inhibiting group used, the case in which both the hydroxyl groups of (a1) and the alcoholic hydroxyl groups of (a2) are protected by acid dissociable dissolution inhibiting groups is usually the most preferred.

Third Structural Unit (a3)

The third structural unit (a3) of the component (A) is a structural unit derived from a styrene, and is represented by a general formula (IV) shown below. In other words, in this description the name styrene describes either the literal styrene, or α-methylstyrene.

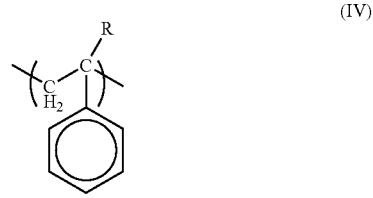

(wherein, R represents a hydrogen atom or a methyl group)

In the component (A), the molar ratio between the structural units (a1) and the structural units (a2), prior to protection with the acid dissociable dissolution inhibiting groups, namely, the ratio first structural units: second structural units, is preferably within a range from 85:15 to 70:30, and even more preferably from 82:18 to 78:22. If the proportion of the second structural units (a2) exceeds the above range, then the solubility of the resin within the developing solution is inadequate, whereas if the proportion is below the above range, the effect achieved by using the second structural units is not adequately manifested.

Furthermore, in the component (A), the combination of the first structural units (a1) and the second structural units (a2) within the copolymer, prior to protection with the acid dissociable dissolution inhibiting groups, preferably accounts for at least 90 mol % of the copolymer, because if the proportion falls below this value, the resolution tends to deteriorate. The proportion of the copolymer accounted for by the combination of the first structural units (a1) and the second structural units (a2) is even more preferably 95 mol % or greater, and is most preferably 100 mol %.

In the present invention, the third structural unit (a3) is not essential, while incorporating the third structural unit provides certain benefits such as improving the depth of focus, and improving the dry etching resistance. If a third structural unit (a3) is used, then it preferably accounts for 0.5 to 10 mol %, and even more preferably from 2 to 5 mol %, of the combined total of the structural units used for forming the component (A). If the quantity of the third structural unit (a3)

exceeds the above range, then the solubility of the resin in the developing solution tends to deteriorate.

In a copolymer comprising the first structural units (a1) and the second structural units (a2) as essential structural units, the weight average molecular weight (the polystyrene-equivalent value, this also applies below) of the copolymer, prior to protection of a portion of the hydroxyl groups with acid dissociable dissolution inhibiting groups, must be 2,000 or more and 8,500 or less, and is preferably 4,500 or more and 8,500 or less, and is most preferably 4,500 or more and 8,000 or less. Ensuring that this weight average molecular weight is no more than 8,500 enables the generation of microbridges to be prevented. Furthermore, if the weight average molecular weight is less than 2,000, then the etching resistance and heat resistance tend to deteriorate.

In this description, the term "microbridge" describes a type of defect, where in a line and space pattern, for example, portions of adjacent resist patterns near the surface of the pattern are linked together via a bridge formed from the resist.

Microbridges are increasingly likely for higher weight average molecular weight values, and for higher temperatures within post exposure baking (PEB).

Furthermore, prior to protection of a portion of the hydroxyl groups with acid dissociable dissolution inhibiting groups, the copolymer is preferably a monodisperse system with a low polydispersity (Mw/Mn ratio), as this provides superior resolution. Specifically, the polydispersity is typically no more than 2.0, and preferably 1.8 or less.

The resin component (A) can be produced by, for example, copolymerizing a monomer that corresponds with the structural unit (a1) without the hydroxyl group protected, and a monomer that corresponds with the structural unit (a2) without the hydroxyl group protected, and then protecting the hydroxyl groups of the units (a1) and/or the units (a2) with acid dissociable dissolution inhibiting groups using a conventional method.

The resin component (A) can also be produced by an alternative method, in which a monomer that corresponds with the structural unit (a1), with the hydroxyl group already protected with an acid dissociable dissolution inhibiting group, is prepared in advance, and this monomer and a monomer corresponding with the structural unit (a2) are copolymerized using normal methods, and hydrolysis is used to convert a portion of the hydroxyl groups that have been protected with acid dissociable dissolution inhibiting groups back to hydroxyl groups, and if required, a portion of the hydroxyl groups of the units (a2) are then protected with acid dissociable dissolution inhibiting groups using a conventional method.

The quantity of the resin component (A) within a positive resist composition of the present invention can be adjusted in accordance with the thickness of the resist film that is to be formed. Typically, the quantity of the resin component (A), expressed as a solid fraction concentration, is within a range from 8 to 25% by weight, and preferably from 10 to 20% by weight.

Acid Generator Component (B)

In the present invention, any of the materials typically used as acid generators in conventional chemically amplified resists can be used as the acid generator component (B).

Of these materials, diazomethane-based acid generators and onium salts are preferred. Specific examples of suitable diazomethane-based acid generators include bis(cyclopentylsulfonyl)diazomethane, bis(isopropylsulfonyl)diazomethane, bis(p-toluenesulfonyl)diazomethane, bis(1,1-dimethylethylsulfonyl)diazomethane, bis(cyclohexylsulfonyl)diazomethane, and bis(2,4-dimethylphenylsulfonyl)diazomethane.

Specific examples of suitable onium salts include diphenyliodonium trifluoromethanesulfonate, (4-methoxyphenyl)phenyliodonium trifluoromethanesulfonate, bis(p-tert-butylphenyl)iodonium trifluoromethanesulfonate, triphenylsulfonium trifluoromethanesulfonate, (4-methoxyphenyl)diphenylsulfonium trifluoromethanesulfonate, (4-methylphenyl)diphenylsulfonium nonafluorobutanesulfonate, (p-tert-butylphenyl)diphenylsulfonium trifluoromethanesulfonate, diphenyliodonium nonafluorobutanesulfonate, bis(p-tert-butylphenyl)iodonium nonafluorobutanesulfonate, and triphenylsulfonium nonafluorobutanesulfonate. Amongst the various onium salts, onium salts with a fluorinated alkylsulfonate ion as the anion are preferred, and of those, triphenylsulfonium nonafluorobutanesulfonate and triphenylsulfonium trifluorometanesulfonate are particularly preferred.

As the component (B), either a single acid generator, or a combination of two or more different acid generators may be used.

The quantity of the component (B) is typically within a range from 1 to 20 parts by weight, and preferably from 2 to 10 parts by weight, per 100 parts by weight of the component (A). If the quantity is lower than the above range, then pattern formation does not progress satisfactorily, whereas if the quantity exceeds the above range, it becomes difficult to achieve a uniform solution, and there is a danger of a deterioration in the storage stability of the composition.

Amine (C)

In a positive resist composition of the present invention, in order to improve the resist pattern shape and the post exposure stability of the latent image formed by the pattern-wise exposure of the resist layer, a known amine compound, and preferably a secondary lower aliphatic amine or a tertiary lower aliphatic amine can be added as an optional component (C).

Here, a lower aliphatic amine refers to an alkyl or alkyl alcohol amine of no more than 5 carbon atoms, and examples of these secondary and tertiary amines include trimethylamine, diethylamine, triethylamine, di-n-propylamine, tri-n-propylamine, triisopropylamine, tripentylamine, diethanolamine, triethanolamine, and triisopropanolamine. Of these, alkanolamines such as triethanolamine or triisopropanolamine and tertiary amines such as triisopropylamine are particularly preferred.

These compounds may be used singularly, or in combinations of two or more different compounds.

This amine is typically added in a quantity within a range from 0.01 to 5.0 % by weight relative to 100 parts by weight of the component (A).

Other Optional Components

Other miscible additives can also be added to a positive resist composition of the present invention according to need, and examples include additive resins for improving the properties of the resist film, surfactants for improving the ease of application, dissolution inhibitors, plasticizers, stabilizers, colorants, and halation prevention agents.

Cross-linking Agent Component (D)

In those cases where a positive resist composition of the present invention is used within a process that incorporates a thermal flow treatment described below, the composition may also comprise a cross-linking agent component (D).

This type of cross-linking agent component (D) is a component that reacts with the resin component (A) on heating and generates cross-linking, and it is possible to use any of the materials already known as suitable cross-linking agents for chemically amplified resist compositions suited to a thermal flow treatment.

Specifically, as the component (D), compounds with at least two cross-linking vinyl ether groups can be used, and examples include polyoxyalkylene glycols such as alkylene glycols, dialkylene glycols, or trialkylene glycols and polyhydric alcohols, in which at least two hydroxyl groups have been substituted with vinyl ether groups, such as trimethylolpropane, pentaerythritol, pentaglycol, or cyclohexyldimethanol. One specific example of a preferred cross-linking agent component (D) is cyclohexyldimethanol divinyl ether.

If used, the quantity of the cross-linking agent component (D) is typically within a range from 0.1 to 25 % by weight, and preferably from 1 to 15 % by weight, relative to 100 parts by weight of the component (A). The cross-linking agent component (D) can use either a single compound, or a combination of two or more different compounds.

Organic Solvent

A positive resist composition according to the present invention can be produced by dissolving the essential components, namely the component (A) and the component (B), together with any optional components such as the component (C) and/or the component (D), in an organic solvent.

The organic solvent may be any solvent capable of dissolving the various components to generate a uniform solution, and one or more solvents selected from known materials used as the solvents for conventional chemically amplified resists can be used.

Specific examples of the solvent include ketones such as acetone, methyl ethyl ketone, cyclohexanone, methyl isoamyl ketone and 2-heptanone; polyhydric alcohols and derivatives thereof such as ethylene glycol, ethylene glycol monoacetate, diethylene glycol, diethylene glycol monoacetate, propylene glycol, propylene glycol monoacetate, dipropylene glycol, or the monomethyl ether, monoethyl ether, monopropyl ether, monobutyl ether or monophenyl ether of dipropylene glycol monoacetate; cyclic ethers such as dioxane; and esters such as methyl lactate, ethyl lactate, methyl acetate, ethyl acetate, butyl acetate, methyl pyruvate, ethyl pyruvate, methyl methoxypropionate, and ethyl ethoxypropionate. These organic solvents can be used alone, or as a mixed solvent containing two or more different solvents.

In particular, mixed solvents of propylene glycol monomethyl ether acetate (PGMEA), and a polar solvent containing a hydroxyl group or a lactone such as propylene glycol monomethyl ether (PGME), ethyl lactate (EL) or γ-butyrolactone offer improved levels of storage stability for the positive resist composition, and are consequently preferred. In the case of a mixed solvent with EL, the weight ratio PGMEA:EL is preferably within a range from 6:4 to 4:6.

In those cases in which PGME is added, the weight ratio of PGMEA:PGME is typically within a range from 8:2 to 2:8, and preferably from 8:2 to 5:5. There are no particular restrictions on the quantity used of the organic solvent, although typically, a sufficient quantity of the solvent is added to produce a combined solid fraction concentration of 5 to 50% by weight, and preferably from 7 to 20% by weight, with the actual quantity adjusted in accordance with the resist application film pressure.

A positive resist composition of the present invention can be used for forming a resist pattern in the same manner as conventional KrF positive resist compositions. The heating temperature used during prebaking and post exposure baking (PEB) is typically 90° C. or higher, and in order to effectively suppress the occurrence of microbridges, the temperature is preferably within a range from 90 to 120° C., and even more preferably from 90 to 110° C.

Whereas the base resin of a conventional KrF positive resist composition is a polyhydroxystyrene-based resin, in a positive resist composition of the present invention, the base resin is a copolymer comprising a structural unit (a1) derived from a hydroxystyrene, and an additional second structural unit (a2) derived from a (meth)acrylate ester containing an alcoholic hydroxyl group, with a weight average molecular weight of 2,000 or more and 8,500 or less, and in which 10 mol % or more and 25 mol % or less of the combined total of the hydroxyl groups within the hydroxystyrene units (a1) and the alcoholic hydroxyl groups within the structural units (a2) are protected with aforementioned acid dissociable dissolution inhibiting groups (the weight average molecular weight following protection is preferably 8,600 or more and 12,000 or less), and by using such a base resin, favorable resolution can be achieved, and the level of developing defects can be reduced. A favorable depth of focus is also obtained.

It is believed that the reason for these findings is that by reducing the proportion of hydroxystyrene-based structural units, which tend to increase the solubility of the resin in the developing solution, and introducing structural units (a2) which tend to reduce the solubility in the developing solution, the solubility of the base resin itself in the developing solution decreases, meaning even if the protection ratio of alkali-soluble hydroxyl groups is reduced, the insolubility of the positive resist composition in the developing solution is still maintained, enabling a superior resolution performance to be achieved. Furthermore, it is also thought that by using structural units (a2) containing alcoholic hydroxyl groups and reducing the protection ratio afforded by the acid dissociable dissolution inhibiting groups, the hydrophilicity of the resist composition can be improved, thereby improving the affinity with the rinse liquid, and thus suppressing the occurrence of developing defects.

The effect of the present invention in suppressing developing defects can be confirmed, for example, by inspecting the resist pattern obtained following developing, using either a SEM (scanning electron microscope) or a developing defect inspection apparatus, and looking for the presence of microbridges and other defects.

Furthermore, the effect of the present invention in improving the resolution performance can be confirmed by inspection of the resist pattern using the aforementioned SEM.

A positive resist composition of the present invention can also be ideally employed within a method of forming a resist pattern that uses a thermal flow treatment described below, and yields a favorable flow rate. In particular, a positive resist composition of the present invention can be used for forming a favorable ultra fine resist pattern via a method of forming a resist pattern that uses a thermal flow treatment, even if the composition contains no cross-linking agent component, which can have a deleterious effect on the storage stability of the resist composition. It is thought that the reason for this finding is that heating actually causes a cross-linking reaction between the different structural units (a1) and (a2) of the component (A). If required, an aforementioned cross-linking agent component (D) may also be included.

Furthermore, as described above, the developing step prior to the thermal flow treatment enables the formation of a resist pattern with a high level of resolution and minimal developing defects, meaning that the narrowed resist pattern obtained by conducting a subsequent thermal flow treatment also displays a high level of resolution performance and a reduced level of defects.

Next is a description of a method of forming a resist pattern according to the present invention, comprising a thermal flow treatment.

First, a positive resist composition of the present invention is applied to the surface of a substrate such as a silicon wafer using a spinner or the like, and a prebake is then conducted. The coating film of the positive resist composition is then selectively exposed with an exposure apparatus through a desired mask pattern, and PEB (post exposure baking) is then conducted. Subsequently, developing treatment is performed using an alkali developing solution, a rinse treatment is then conducted to wash away any developing solution left on the surface of the substrate, together with those sections of the resist composition that have dissolved in the developing solution, and the substrate is then dried.

The steps up until this point can be conducted using conventional methods. The operational conditions and the like can be selected appropriately in accordance with the makeup and characteristics of the positive resist composition that is used.

The exposure is preferably conducted using a KrF excimer laser, although compositions of the present invention can also be used with electron beams and EUV (extreme ultraviolet light).

An organic or inorganic anti-reflective film may also be provided between the substrate and the coating film of the resist composition.

Subsequently, a thermal flow treatment is performed on the thus formed resist pattern, thereby narrowing the resist pattern.

A thermal flow treatment is conducted by heating the resist pattern at least once. Increasing the number of heating repetitions enables the degree of variation in the resist pattern size per unit of temperature (hereafter referred to as the flow rate) to be reduced, and is consequently preferred. However, the number of steps increases, and the time required for the treatment increases, which causes a lowering of the throughput.

Lower flow rates in the thermal flow treatment produce a higher level of in-plane uniformity for the pattern dimensions of the narrowed resist pattern formed on the wafer, and the cross-sectional shape of the resist pattern is also superior. If the thickness of the resist film is 1,000 nm or less, then the film thickness has almost no effect on the-flow rate.

The heating temperature used in the thermal flow treatment is selected in accordance with the composition of the resist pattern, and is typically selected within a range from 100 to 200° C., and preferably from 110 to 180° C. In those cases where 2 or more heating steps are conducted, the second and any subsequent heating steps are conducted at either the same temperature as, or a higher temperature than, the first heating step.

There are no particular restrictions on the heating time, provided it does not hinder throughput, and yields the desired resist pattern size. Typically, each heating repetition is conducted for a time within a range from 30 to 270 seconds, and preferably from 60 to 120 seconds.

A method of forming a resist pattern that employs a thermal flow treatment can be favorably used in the formation of the types of ultra fine resist patterns that are difficult to form using typical methods. A method of forming a resist pattern according to the present invention is conducted using a positive resist composition of the present invention, and consequently, a favorable flow rate can be obtained both for compositions which contain no cross-linking agent, and compositions which also comprise an aforementioned cross-linking agent component (D). Accordingly, a narrowed resist pattern can be obtained which displays a high level of resolution, a favorable cross-sectional shape for the resist pattern, minimal developing defects, and a high degree of in-plane uniformity for the pattern dimensions.

EXAMPLES

As follows is a more detailed description of the present invention, using a series of examples.

Example 1

First, the component (A) was prepared. Namely, a copolymer formed from p-hydroxystyrene and the adamantanol methacrylate of the above general formula (IIa), in which R is a methyl group (molar ratio: 80:20, weight average molecular weight (Mw): 8,000, polydispersity (Mw/Mn): 1.78), and ethyl vinyl ether were reacted together by normal methods in the presence of an acid catalyst, thus forming a resin in which some of the hydroxyl groups of the copolymer had been protected with 1-ethoxyethyl groups, and this resin was used as the component (A).

When this resin was analyzed by $^1$H-NMR, the quantity of 1-ethoxyethoxy groups relative to the total number of hydroxyl groups within the p-hydroxystyrene and adamantanol that were used was 18%. This indicates a protection ratio for the hydroxyl groups of 18 mol %. The weight average molecular weight (Mw) of the protected resin was 11,000, and the polydispersity (Mw/Mn) was 1.8.

100 parts by weight of this component (A); 5.0 parts by weight of bis(cyclohexylsulfonyl)diazomethane, 6.0 parts by weight of bis(isopropylsulfonyl)diazomethane, and 2.0 parts by weight of triphenylsulfonium trifluoromethanesulfonate as the component (B); and 0.15 parts by weight of triethanolamine and 0.15 parts by weight of triisopropylamine as the component (C) were dissolved in 500 parts by weight of a mixed solvent of PGMEA and EL (with a weight ratio PGMEA:EL of 6:4), thus yielding a positive resist composition.

Meanwhile, a substrate was prepared by layering an organic anti-reflective film (brand name DUV-44, manufactured by Brewer Science Ltd.) on top of an 8 inch diameter silicon wafer, and then heating at 205° C. to form a film of thickness 65 nm.

The positive resist composition obtained above was applied to the surface of this substrate using a spinner. The composition was then prebaked and dried on a hotplate at 100° C. for 90 seconds, forming a resist layer with a film thickness of 410 nm.

This layer was then selectively irradiated with a KrF excimer laser (248 nm), through a typical chrome reticle which is a mask used in reduced projection exposure, using a KrF scanner NSR-S203B (manufactured by Nikon Corporation, NA (numerical aperture)=0.68, ⅔ annular illumination).

Subsequently, the irradiated resist was subjected to PEB treatment at 110° C. for 60 seconds, was then subjected to puddle development for 60 seconds at 23° C. in a 2.38% by weight aqueous solution of tetramethylammonium hydroxide, and was then rinsed by washing for 15 seconds with pure water. The resist was then shaken dry, and then further dried by heating at 100° C. for 60 seconds, thus forming a resist pattern.

In this manner, a resist hole pattern with a hole diameter of 140 nm was formed. Inspection of the surface state of the substrate on which the resist pattern had been formed using a surface defect inspection apparatus KLA2132, manufactured by KLA Tencor Corporation, revealed only a very small number of surface defects of no more than 10, indicating an effective suppression of developing defects. Measurement of the pure water contact angle (the stationary contact angle, this also applies below) of the unexposed portions revealed a value of 59 degrees, indicating favorable hydrophilicity. The depth of focus of the 140 nm resist hole pattern was 0.6 µm. Furthermore, inspection of a 1:1 line and space resist pattern formed in a similar manner revealed that excellent resolution was achieved at a line width of 120 nm.

Comparative Example 1

Instead of the component (A) from the example 1, a resin component comprising poly(p-hydroxystyrene) (weight average molecular weight: 8,000, polydispersity: 1.10) in which a portion of the hydroxyl groups had been protected with 1-ethoxyethyl groups (hydroxyl group protection ratio: 39 mol %) was used. The weight average molecular weight (Mw) of the protected resin was 9,000, and the polydispersity (Mw/Mn) was 1.15.

With the exception of using this resin component, a resist composition was prepared in the same manner as the example 1, and the same method was then used to form a resist pattern.

In this manner, a resist hole pattern with a hole diameter of 140 nm was formed. When the surface of the substrate on which the resist pattern had been formed was inspected for developing defects in the same manner as the example 1, approximately 1300 defects were observed. When the pure water contact angle was measured in the same manner as described above, the result was 72 degrees, indicating a lower level of hydrophilicity than the example 1. The depth of focus of the 140 nm resist hole pattern was 0.45 µm. Furthermore, inspection of a 1:1 line and space resist pattern formed in the same manner as the example 1 revealed that although excellent resolution was achieved at a line width of 130 nm, resolution was inadequate at a line width of 120 nm.

Comparative Example 2

With the exception of altering the protection ratio for the hydroxyl groups within the resin component to 30 mol %, a resist composition was prepared in the same manner as the example 1, and the same method was then used to form a resist pattern.

Testing of the resist pattern in the same manner as above revealed only 10 defects, but the depth of focus of the 140 nm resist hole pattern was small, at only 0.25 µm. The pure water contact angle was 70 degrees. Furthermore, inspection of a 1:1 line and space resist pattern formed in the same manner as the example 1 revealed that although excellent resolution was achieved at a line width of 150 nm, resolution was inadequate at a line width of 140 nm.

Comparative Example 3

Instead of the component (A) from the example 1, a copolymer formed from p-hydroxystyrene and adamantanol methacrylate (molar ratio: 80:20, weight average molecular weight: 11,000, polydispersity: 1.8), was reacted with ethyl vinyl ether in the same manner as the example 1, thus forming a resin in which some of the hydroxyl groups of the copolymer had been protected with 1-ethoxyethyl groups, and this resin was used as the component (A).

When this resin was analyzed by $^1$H-NMR, the quantity of 1-ethoxyethoxy groups relative to the total number of hydroxyl groups within the p-hydroxystyrene and adamantanol that were used was 22%. This indicates a protection ratio for the hydroxyl groups of 22 mol %. The weight average molecular weight (Mw) of the protected resin was 18,000, and the polydispersity (Mw/Mn) was 3.0.

Subsequently, with the exception of using this copolymer as the component (A), a resist composition was prepared in the same manner as the example 1, and the same method was then used to form a resist pattern.

In this manner, a resist hole pattern with a hole diameter of 140 nm was formed. When the surface of the substrate on which the resist pattern had been formed was inspected for developing defects in the same manner as the example 1, more than 10,000 defects were observed, and the occurrence of microbridges was also confirmed. When the pure water contact angle was measured in the same manner as described above, the result was 64 degrees. Because the level of developing defects was so high, the other properties were not evaluated.

Example 2

The same positive resist composition as the example 1 was prepared.

This positive resist composition was applied with a spinner to the surface of a substrate comprising the same anti-reflective film as that used in the example 1. The composition was then prebaked and dried on a hotplate at 100° C. for 90 seconds, forming a resist layer with a film thickness of 410 nm.

This layer was then selectively irradiated with a KrF excimer laser (248 nm), through a 6% half tone reticle, using the same KrF scanner as that used in the example 1.

Subsequently, the irradiated resist was subjected to PEB treatment at 110° C. for 90 seconds, and was then subjected to developing, water rinsing, and drying in the same manner as the example 1, thus forming a resist pattern.

In this manner, a resist hole pattern with a hole diameter of 150 nm was formed. Inspection of the surface state of the substrate, on which the resist pattern had been formed in the same manner as the example 1, revealed only a very small number of surface defects of no more than 10. The depth of focus of the 150 nm resist hole pattern was 0.6 µm. Measurement of the hole diameter of the resist hole pattern was conducted using a measuring SEM.

Subsequently, the thermal flow treatment was performed on the substrate comprising the resist hole pattern, by heating the substrate on a hotplate under predetermined conditions, thus producing a narrowed resist hole pattern.

The flow rate was determined by altering the heating conditions used in the thermal flow treatment, while measuring the dimensions of the resulting resist hole pattern. In other words, five of the above substrates with a resist hole pattern of diameter 150 nm formed thereon were prepared in the manner described above, and these substrates were heated for 90 seconds at 140° C., 145° C., 150° C., 155° C., and 160° C. respectively. At each temperature, the heating caused a narrowing of the resist hole pattern, yielding a narrowed resist hole pattern of favorable shape, although the hole diameter following narrowing varied depending on the heating temperature used. A graph was prepared showing temperature along the horizontal axis, and the degree of dimensional variation in the resist pattern (the variation in the hole diameter) at each temperature along the vertical axis, and this graph was used to determine the resist pattern dimensional variation per unit of temperature variation (° C.), namely the flow rate, at the point where the resist pattern dimension (the hole diameter) following narrowing was 100 nm.

The resist pattern dimensions (hole diameters) following narrowing were 147 nm at 140° C., 140 nm at 145° C., 128 nm at 150° C., 100 nm at 155° C., and 80 nm at 160° C., and the flow rate required for a narrowed hole diameter of 100 nm was 4.8 nm/° C.

Comparative Example 4

Instead of the component (A) from the example 2, a combination of a first resin component comprising poly(p-hydroxystyrene) (weight average molecular weight: 20,000, polydispersity 1.12) in which 30 mol % of the hydroxyl groups had been protected with 1-ethoxyethyl groups, and a second resin component comprising poly(p-hydroxystyrene) (weight average molecular weight: 8,000, polydispersity 1.10) in which 30 mol % of the hydroxyl groups had been protected with tert-butoxycarbonyl groups was used. The weight ratio between the first resin component and the second resin component was 6:4. Following protection, the weight average molecular weight (Mw) of the first resin component was 22,000, and the polydispersity (Mw/Mn) was 1.2, whereas the weight average molecular weight Mw) of the second resin component following protection was 9,000, and the polydispersity (Mw/Mn) was 1.15.

100 parts by weight of this combination of the first resin component and the second resin component, 5.0 parts by weight of bis(cyclohexylsulfonyl)diazomethane and 2.0 parts by weight of triphenylsulfonium trifluoromethanesulfonate as the component (B), 0.16 parts by weight of triethanolamine as the component (C), and 5.0 parts by weight of cyclohexyldimethanol divinyl ether as the cross-linking agent component (D) were dissolved in 500 parts by weight of a mixed solvent of PGMEA and EL (with a weight ratio PGMEA:EL of 6:4), thus yielding a positive resist composition.

Using the thus formed positive resist composition, a resist pattern was formed in the same manner as the example 2.

In this manner, a resist hole pattern with a hole diameter of 150 nm was formed. Inspection of the surface state of the substrate on which the resist pattern had been formed in the same manner as the example 1, revealed approximately 60 developing defects.

Subsequently, the thermal flow treatment was conducted in the same manner as the example 2, and the flow rate was determined.

The resist pattern dimensions (hole diameters) following the thermal flow treatment were 150 nm at 140° C., 150 nm at 145° C., 125 nm at 150° C., 82 nm at 155° C., and 44 nm at 160° C., and the flow rate required for a narrowed hole diameter of 100 nm was 8.6 nm/° C.

Example 3

A copolymer formed from p-hydroxystyrene and the adamantanol acrylate of the above general formula (IIa), in which R is a hydrogen atom (molar ratio: 80:20, weight average molecular weight: 8,000, polydispersity (Mw/Mn): 1.5), and ethyl vinyl ether were reacted together by normal methods in the presence of an acid catalyst, thus forming a resin in which some of the hydroxyl groups of the copolymer had been protected with 1-ethoxyethyl groups, and this resin was used as the component (A).

When this resin was analyzed by $^1$H-NMR, the quantity of 1-ethoxyethoxy groups relative to the total number of hydroxyl groups within the p-hydroxystyrene and adamantanol that were used was 23.9%. This indicates a protection ratio for the hydroxyl groups of 23.9 mol %. The weight average molecular weight (Mw) of the protected resin was 8,700, and the polydispersity (Mw/Mn) was 1.6.

100 parts by weight of this component (A), 8.0 parts by weight of bis(cyclopentylsulfonyl)diazomethane, and 2.5 parts by weight of triphenylsulfonium nonafluorobutanesulfonate as the component (B), and 0.23 parts by weight of triethanolamine and 0.05 parts by weight of triisopropanolamine as the component (C), were dissolved in 500 parts by weight of a mixed solvent of PGMEA and EL (with a weight ratio PGMEA:EL of 6:4), thus yielding a positive resist composition.

Meanwhile, a substrate was prepared by layering an organic anti-reflective film (brand name DUV-44, manufactured by Brewer Science Ltd.) on top of an 8 inch diameter silicon wafer and then heating at 225° C. to form a film of thickness 65 nm. The positive resist composition obtained above was applied to the surface of this substrate using a spinner, and the composition was then prebaked and dried on a hotplate at 100° C. for 60 seconds, forming a resist layer with a film thickness of 480 nm.

This layer was then selectively irradiated through a 8% half tone reticle using a KrF scanner NSR-S203B (manufactured by Nikon Corporation, NA (numerical aperture)=0.68, 2/3 annular illumination).

Subsequently, the irradiated resist was subjected to PEB treatment at 110° C. for 60 seconds, was then subjected to puddle development for 60 seconds at 23° C. in a 2.38% by weight aqueous solution of tetramethylammonium hydroxide, and was then rinsed by washing for 15 seconds with pure water. The resist was then shaken dry, and then further dried by heating at 100° C. for 60 seconds, thus forming a resist pattern.

In this manner, a resist hole pattern with a hole diameter of 140 nm was formed. The depth of focus of the 140 nm resist hole pattern was 0.5 μm. Furthermore, inspection of a 1:1 line and space resist pattern formed in a similar manner revealed that excellent resolution was achieved at a line width of 120 nm. The depth of focus in this case was 0.6 μm. Inspection of the surface state of the substrate on which the 140 nm hole pattern had been formed using a surface defect inspection apparatus KLA2132, manufactured by KLA Tencor Corporation, revealed no microbridges, indicating an effective suppression of developing defects.

INDUSTRIAL APPLICABILITY

As described above, according to a positive resist composition of the present invention, favorable resolution performance can be achieved, and the level of developing defects can be reduced.

A positive resist composition of the present invention can also be favorably employed within a pattern formation method that uses a thermal flow treatment, and yields a favorable flow rate.

By using a positive resist composition of the present invention and employing a pattern formation method that uses a thermal flow treatment, the level of resolution performance in the developing step is high, and developing defects can be prevented, meaning a high level of resolution performance and reduced defects can be achieved even for the narrowed resist pattern produced following the thermal treatment. Furthermore, a positive resist composition of the present invention undergoes a favorable thermal flow treatment even without the inclusion of a cross-linking agent component.

Accordingly, the present invention is extremely useful industrially.

The invention claimed is:

1. A method of using a positive resist composition, comprising: applying the positive resist composition on a substrate to form a positive resist film, performing selective exposure of the positive resist film, conducting a developing treatment to form a resist pattern, and subjecting the resist pattern to a thermal flow treatment, thereby narrowing the resist pattern, wherein the positive resist composition comprises:

a resin component (A) containing an acid dissociable dissolution inhibiting group whose alkali solubility increases under action of acid; and an acid generator component (B) that generates acid on exposure, wherein the resin component (A) is a copolymer comprising a first structural unit (a1) derived from a hydroxystyrene and a second structural unit (a2) derived from a (meth)acrylate ester containing an alcoholic hydroxyl group, in which 10 mol % or more and 25 mol % or less of a combined total of hydroxyl groups within the structural units (a1) and alcoholic hydroxyl groups within the structural units (a2) are protected with the acid dissociable dissolution inhibiting groups, a weight average molecular weight of the copolymer prior to protection with the acid dissociable dissolution inhibiting groups is 4,000 or more and 8,000 or less, a molar ratio between the first structural units (a1) and the second structural units (a2) within the resin component (A) prior to protection with the acid dissociable dissolution inhibiting groups is within a range from 80:20 to 70:30, the second structural unit (a2) is derived from a (meth)acrylate ester containing an adamantyl group with an alcoholic hydroxyl group, and the acid dissociable dissolution inhibiting group is a 1-lower alkoxyalkyl group.

2. A method of forming a resist pattern comprising:

forming a positive resist film on a substrate using a positive resist composition:

performing selective exposure of the positive resist film;

conducting a developing treatment to form a resist pattern; and subjecting the resist pattern to a thermal flow treatment, thereby narrowing the resist pattern, wherein the positive resist composition comprises:

a resin component (A) containing an acid dissociable dissolution inhibiting group whose alkali solubility increases under action of acid; and an acid generator component (B) that generates acid on exposure, wherein the resin component (A) is a copolymer comprising a first structural unit (a1) derived from a hydroxystyrene and a second structural unit (a2) derived from a (meth)acrylate ester containing an alcoholic hydroxyl group, in which 10 mol % or more and 25 mol % or less of a combined total of hydroxyl groups within the structural units (a1) and alcoholic hydroxyl groups within the structural units (a2) are protected with the acid dissociable dissolution inhibiting groups, a weight average molecular weight of the copolymer prior to protection with the acid dissociable dissolution inhibiting groups is 4,000 or more and 8,000 or less, a molar ratio between the first structural units (a1) and the second structural units (a2) within the resin component (A) prior to protection with the acid dissociable dissolution inhibiting groups is within a range from 80:20 to 70:30, the second structural unit (a2) is derived from a (meth)acrylate ester containing an adamantyl group with an alcoholic hydroxyl group, and the acid dissociable dissolution inhibiting group is a 1-lower alkoxyalkyl group.

* * * * *